United States Patent [19]
Fang

[11] Patent Number: 5,856,947
[45] Date of Patent: Jan. 5, 1999

[54] INTEGRATED DRAM WITH HIGH SPEED INTERLEAVING

[75] Inventor: Hong-Gee Fang, Los Altos, Calif.

[73] Assignee: S3 Incorporated, Santa Clara, Calif.

[21] Appl. No.: 920,604

[22] Filed: Aug. 27, 1997

[51] Int. Cl.$^6$ ................................................. G11C 16/04
[52] U.S. Cl. ............................... 365/189.01; 365/189.02; 365/230.03; 365/230.04
[58] Field of Search .................... 365/189.01, 230.01, 365/230.02, 230.03, 230.04, 233, 222

[56] References Cited

U.S. PATENT DOCUMENTS

| | | | |
|---|---|---|---|
| 4,899,312 | 2/1990 | Sato | 365/230.09 |
| 4,941,129 | 7/1990 | Oshima et al. | 365/230.03 |
| 5,493,535 | 2/1996 | Cho | 365/230.04 |
| 5,568,427 | 10/1996 | Takemae | 265/189.02 |
| 5,570,320 | 10/1996 | Runas | 365/230.03 |
| 5,600,605 | 2/1997 | Schaefer | 365/233 |
| 5,619,473 | 4/1997 | Hotta | 365/238.5 |
| 5,627,791 | 5/1997 | Wright et al. | 365/222 |

*Primary Examiner*—Son T. Dinh
*Assistant Examiner*—Tuan T. Nguyen
*Attorney, Agent, or Firm*—Fenwick & West LLP

[57] ABSTRACT

An integrated circuit includes a controller and a memory to implement a graphics controller. The controller and memory are controlled by a common clock signal to operate synchronously with each other. The memory is organized in a plurality of storage arrays, organized in two banks. A set of bit-line sense amplifiers is provided for each bank. A pair of row decoders decode a row address to select a row of data from each bank. The selected row of data is received by a pair of bit-line sense amplifiers. A column decoder selects a column of data from the pair of bit-line sense amplifiers. A pair of multiplexers select one-half of the selected column in response to a HI/LO signal and then select the remaining half of the selected data in response to a change in value of the HI/LO signal. Main or data sense amplifiers amplify the output of the multiplexers to provide data outputs in the form of full swing signals.

18 Claims, 3 Drawing Sheets

INTEGRATED DRAM WITH HIGH SPEED INTERLEAVING

FIELD OF THE INVENTION

This invention relates generally to the field of digital memory systems.

BACKGROUND OF THE INVENTION

High performance data processing systems require digital memory systems which are capable of storing and providing large amounts of data at very high speeds. For example, graphics controllers which operate in conjunction with a host computer to perform sophisticated image manipulation and rendering functions to generate data for display on a display screen, require memories which are capable of storing and providing the amount of data required of such functions at very high data rates.

Dynamic Random Access Memories (DRAMs) are often used to meet the storage requirements required by high performance systems. DRAMs are typically characterized by a greater storage density per chip when compared to static random access memories (SRAMs). However, DRAMs are also typically characterized by slower access times then SRAMs.

A variety of techniques have been used to increase the bandwidth of digital memory systems employing DRAMs. For example, the memory, and the data paths to and from the memory, may be organized to allow multiple words of data to be retrieved in a single access. Although such a technique provides increased bandwidth, there remains a need for digital memory systems which provide even greater data storage and data throughput than is currently available.

SUMMARY OF THE INVENTION

In a principal aspect, embodiments of the present invention provide a memory system capable of providing data at high rates. Presentation of a row address to the memory system results in a row of data being read out of parallel storage arrarys in the memory system by a plurality of Bit-Line Sense Amplifiers (BLSA). Presentation of a column address to the memory system causes selection of a corresponding column of data in the selected row. The selected column of data is retrieved in two phases by toggling of the least significant bit of the column address. Advantageously, the signals in the memory system are of the small signal differential type of signal produced by the BLSAs, and are not amplified by main sense amplifiers (MSA) until selection of each of the subsets or phases for output. This advantageous feature allows a reduction in the number of MSAs required for the memory system. The result is fewer hardware elements, fewer routing lines to connect such components and lower power consumption. A further advantage is that output of the selected column in two subsets or phases results in higher data throughput by allowing the least significant column address bit to be switched at a rate approximately twice as fast as the column address. This feature provides the advantage of allowing simple and more direct routing of the single, least significant bit of the column address for higher speed switching. The lower frequency switching required of the column address imposes fewer constraints on the routing of the column address signals in the IC chip, thus reducing design complexity.

These and other features and advantages of the present invention may be better understood by considering the following detailed description of a preferred embodiment of the invention. In the course of this description, reference will frequently be made to the attached drawings.

DETAILED DESCRIPTION

Figure 1:
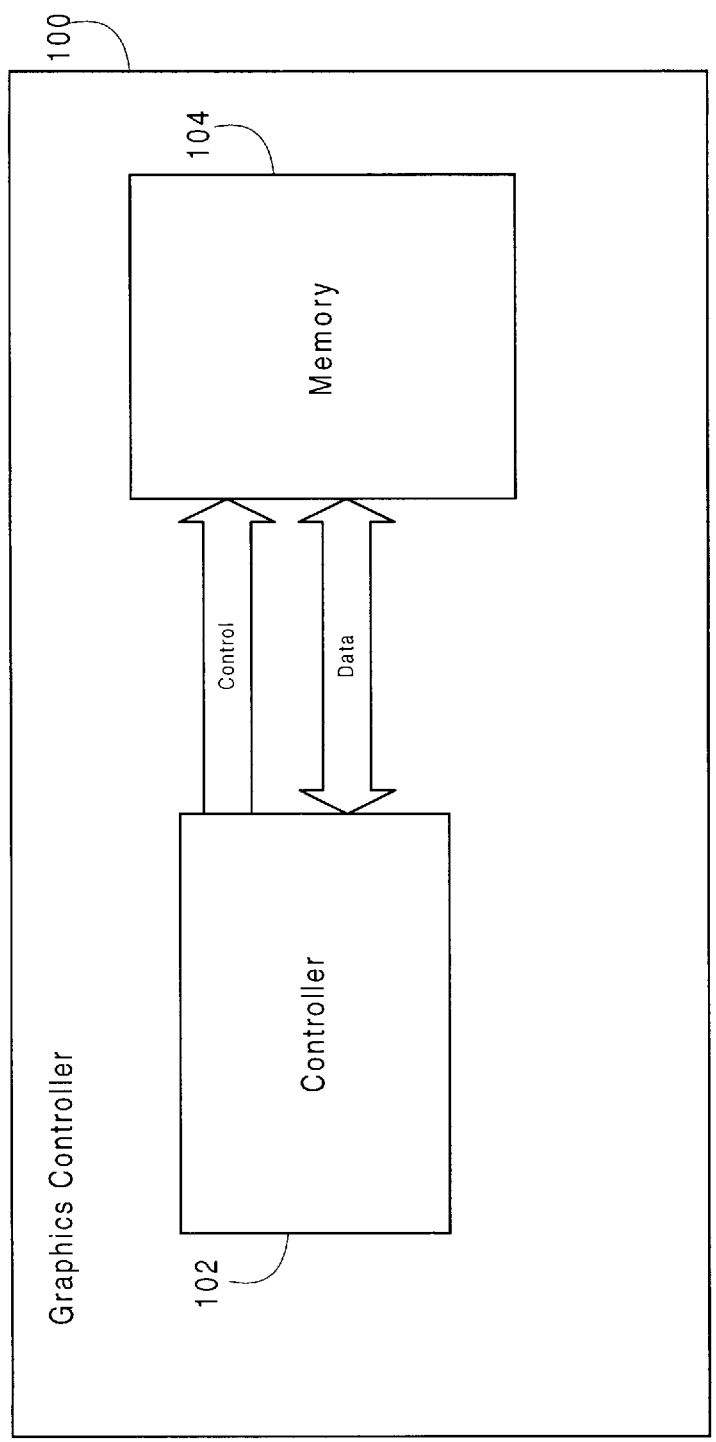
FIG. 1 is a high-level block diagram of a graphics controller chip which employs the principles of the present invention.

In FIG. 1 of the drawings, a graphics controller is implemented in an Integrated Circuit (IC) 100 which includes a controller 102 and a memory 104. The graphics controller preferably operates in conjunction with a microprocessor (not shown) to receive data and commands from the microprocessor, to store data in the memory 104, to manipulate the data via the controller 102 and to display the data onto a visual display (not shown) by generation of appropriate control signals. An example of the functions performed by the controller is provided in a data book published by S3 Incorporated of Santa Clara, Calif., entitled *ViRGE Integrated 3D Accelerator*, published August 1996. This data book describes many of the functions performed by the ViRGE graphics accelerator chip sold by S3 Incorporated.

Memory 104 preferably takes the form of a Dynamic Random Access Memory (DRAM). In a preferred embodiment, the controller 102 and the memory 104 are coupled by a data path which is 128 bits wide allowing transfers between the controller and the memory of 128 bits per clock cycle. The memory 104 stores and outputs data in response to control signals generated by the controller 102.

Figure 2:
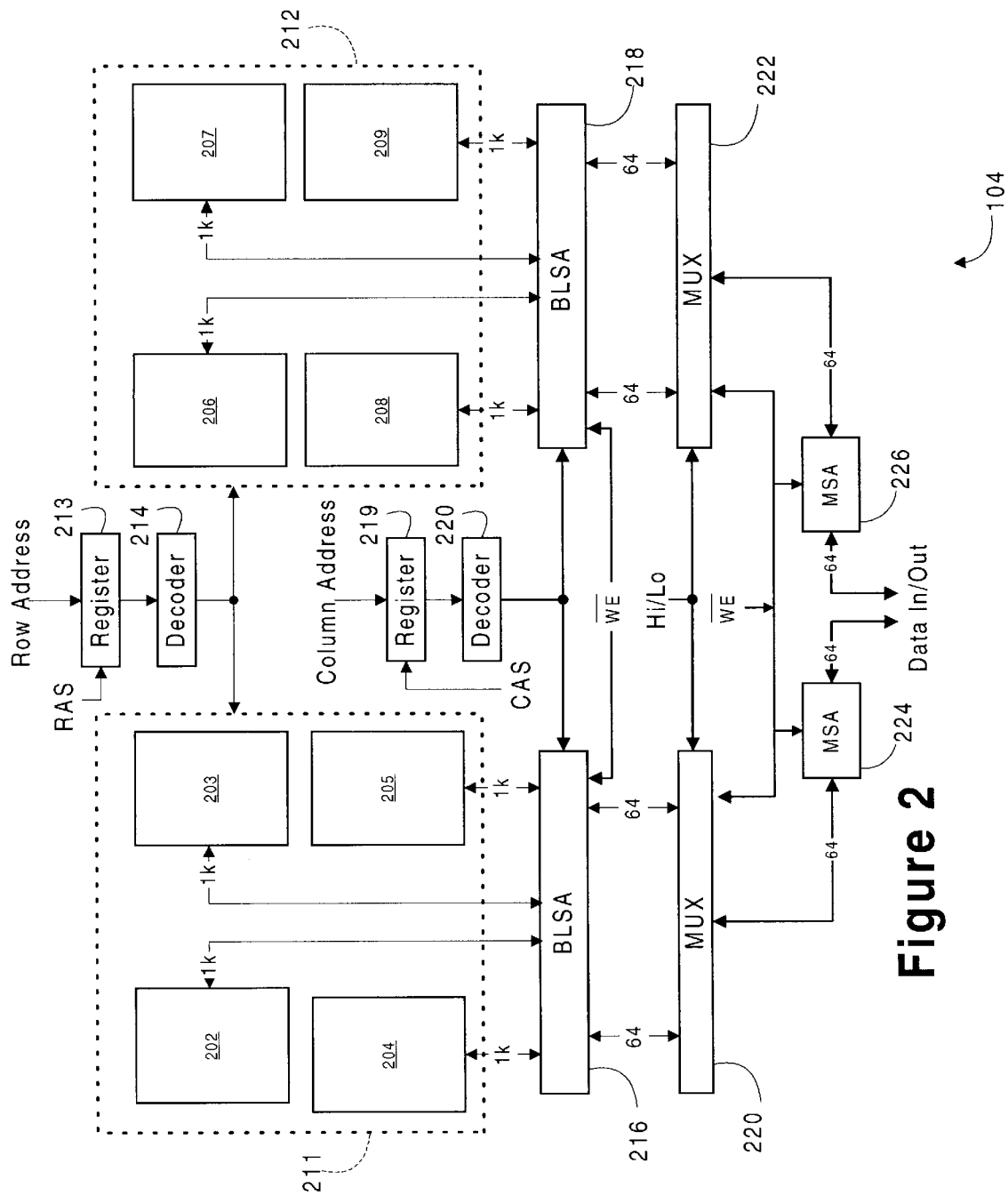
FIG. 2 is a block diagram of a preferred embodiment of the memory system of FIG. 1.

FIG. 2 of the drawings is a block diagram illustrating further details of the memory 104. The memory 104 includes a plurality of storage arrays 202, 203, 204, 205, 206, 207, 208 and 209 which are alike in structure and storage capacity. The storage arrays 202–209 are organized in two banks 211 and 212 which may be referred to as an odd bank and an even bank, respectively. The storage arrays are conventional DRAM type storage arrays which employ a one transistor-one capacitor per cell structure to achieve high density. In a preferred embodiment, each of the storage arrays 202–209 contains 256 rows each containing 1 K bits. Thus, each bank 211, 212 stores 256×1k×4=1M bit of data, for a total memory capacity between the two banks of 2M bits.

The data stored in the storage arrays is accessed by decoding a row address with decoder 214. In a preferred embodiment the row address is 8 bits to correspond to 256 rows in the banks 211 and 212. The row address is stored in a register 213 in response to a Row Address Strobe (RAS) signal generated by controller 102. The decoder 214 selects one of 256 rows in the storage arrays 202–209 to be read out by two sets of bit-line sense amplifiers (BLSA) 216 and 218.

The row address decoded by decoder 214 is supplied to each array of each bank to generate a row of data which is 8k bits wide. BLSA 216 senses and amplifies the data stored in the storage cells contained in the odd half 211 of the row selected by row decoder 214. BLSA 218 operates similarly with even half of the row selected in bank 212.

A column address received from controller 102 is stored in register 219, in response to a Column Address Strobe (CAS) signal from controller 102. The column address in register 219 is decoded by a decoder 220 to select 256 bits from the 8k bits stored in BLSA 216 and 218. Multiplexers 220 and 222 perform a two-to-one multiplexing function. Multiplexer 220 receives 128 bits from BLSA 216 into 64 pairs of two-to-one multiplexers. Multiplexer 222 is similarly organized and operates in a similar manner with respect to BLSA 218. Multiplexers 220 and 222 are both controlled by a HI/LO signal generated by the controller 102. The HI/LO signal corresponds to the least significant bit of the column address. Once BLSAs 216 and 218 have sensed and amplified the data in each of the storage cells of the selected row, 128 bits of data representing a half column of data are available to the controller 102 from the memory 104. As can be seen from FIG. 2, each 128 bit quantity of data provided by memory 104 consists of 64 bits of data from odd bank 211 and 64 bits of data from even bank 212. Once the controller 102 has captured the first 128 bits of data, the HI/LO signal is toggled to change its value from a binary 0 to a binary 1, or alternatively from a binary 1 to a binary 0, to cause multiplexers 220 and 222 to select the other 64 bits of data received from BLSAs 216 and 218, respectively.

As can be seen, toggling of the HI/LO signal causes another 128 bits of data to be outputted by the memory 104. Use of the HI/LO signal to retrieve an additional 128 bits of information is advantageous in that only one signal needs to be toggled to generate an additional 128 bits of data instead of changing of an entire address bus. This simplifies routing of the IC chip 100 by allowing the single HI/LO signal to be designated as a critical path and to be routed on the IC chip 100 in an optimal manner to allow for higher frequency switching, than would be possible for the row address lines or the column address lines.

Data selected by multiplexers 220 and 222 is amplified by an odd and even set of Main Sense Amplifiers (MSA) 224 and 226. The MSAs 224 and 226 are conventional and are also commonly known as data sense amplifiers. The MSAs 224 and 226 operate in a conventional fashion to convert the small (differential) type signal generated by BLSA's 216 and 218 into full swing signals useable by the controller 102.

The foregoing description has focused on a read operation in which data is retrieved from the memory 104. A write operation operates similarly in all respects except that a write enable signal is generated by controller 102 and data is provided to the memory 104 for writing into the storage arrays. The MSA's 224 and 226 convert the received full swing data signals into small signals. The resulting signals are then written into the appropriate location in banks 211 and 212 in response to appropriate row and column addresses, RAS and CAS signals and the write enable signal. In FIG. 2 the write enable signal is shown generally. Control of the memory system including the data paths internal to the system to distinguish between read and write operations is conventional and will be understood by those skilled in the art in view of the present disclosure.

Figure 3:
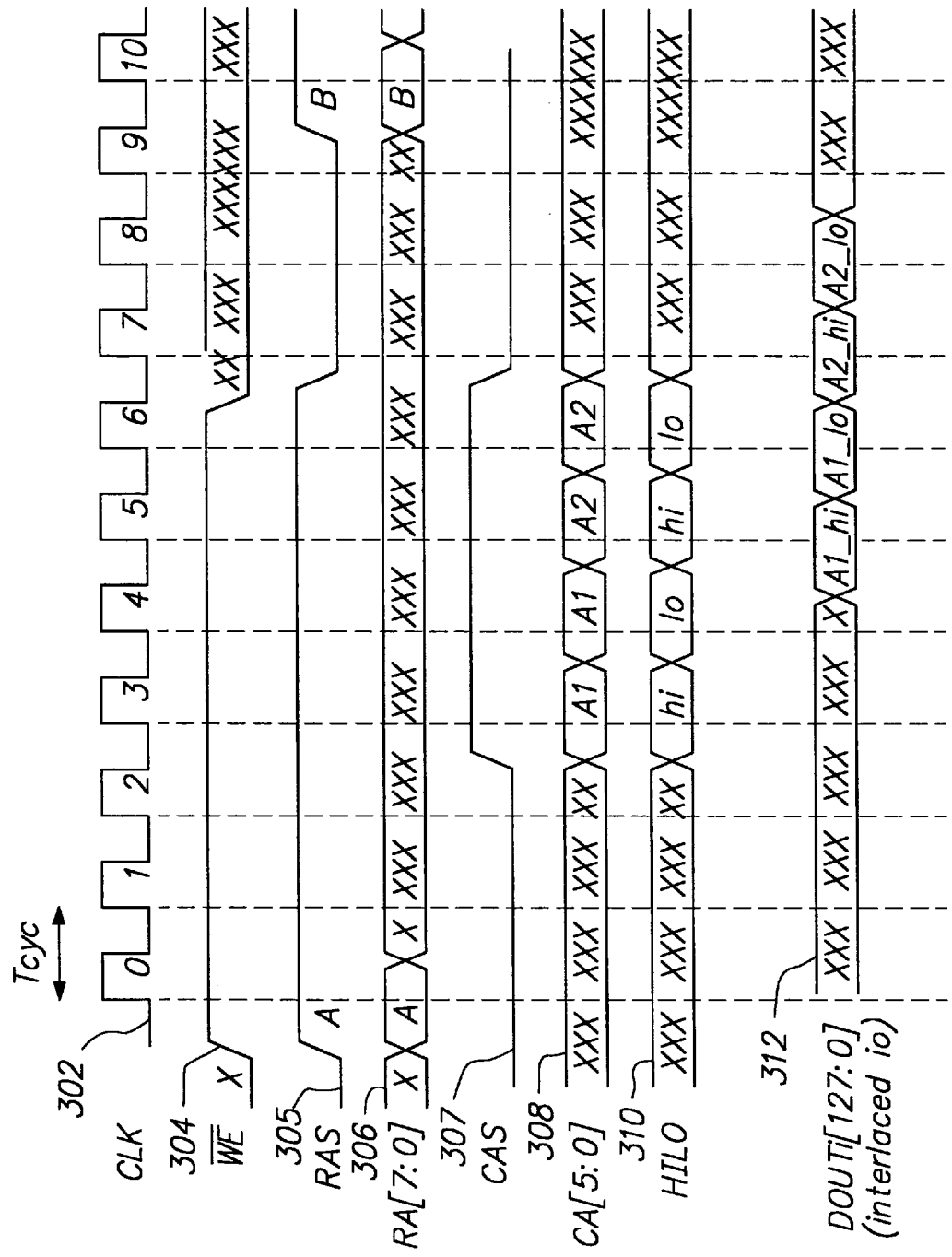
FIG. 3 is a timing diagram showing operation of a preferred embodiment.

FIG. 3 of the drawings is a timing diagram showing the relationship of the signals sent by controller 102 to memory 104 to obtain four data words. The data, address and control signals generated by the controller 102 are generated synchronously with a clock signal designated in FIG. 3 as CLK, and shown at 302. A Write Enable (WE) signal shown at 304 controls whether a memory operation is for reading or for writing. The Write Enable signal is shown as an active low signal, meaning that when it has a logical 0 value, it controls the writing of data into the memory 104, and when it has a logical 1 value, it is inactive and data is then read from memory. The row address to the memory is shown at 306 and as explained above, preferably comprises 8 bits to select one of 256 rows. Use of the row address 306 by the memory 104 is controlled by the RAS signal 305 which causes the row address to be stored into register 213. The column address signal as noted above preferably comprises 6 bits and is shown at 308. Use of the column address is controlled by the CAS signal shown at 307, which causes the column address to be stored in register 219. The HI/LO signal is shown at 310. Data outputted by the memory 104 is shown at 312.

The timing diagram of FIG. 3 shows a read operation. The read operation takes eight clock cycles as shown by the individually numbered clock signals at 302. In the cycle before cycle 0, a row address is placed onto the row address bus by the controller 102 and the RAS signal is asserted to store the row address into the register 213. In clock cycle 2, after a sufficient amount of time has been allowed for the row address to be decoded and to allow the data in the decoded row to be sensed into the sense amplifiers 216 and 218, the column address is provided to select one of the two columns in the selected row and the CAS signal 307 is asserted to cause the column address to be stored. The CAS signal as seen is asserted at cycle 2. At cycle 4, the first 128 bits of data becomes available in the selected row. At cycle 3, the HI/LO signal is toggled to cause the second 128 bits of data to become available at cycle 5. Also at cycle 5, the column address is changed to select the second column of data stored in the sense amplifiers 216 and 218. This causes a third 128 bits of data to become available at cycle 6, during which cycle the HI/LO signal is toggled once again to cause a fourth 128 bits of data to become available in cycle 7. The second column address may be but need not be sequential to the first address. Once the second column address has been asserted at cycle 5, in the following cycle RAS and CAS are deactivated as they are no longer needed. This allows another memory cycle to start at cycle 9. As seen from the timing diagram of FIG. 3, a total of 512 bits of data are accessed by using the single row address. The HI/LO signal is toggled at a frequency which is twice the frequency at which the column address is required to change. This reduces the number of critical paths required in the memory 104 and allows the frequency of the clock to be increased in comparison to using four different column addresses to retrieve the same amount of data.

It is to be understood that the specific mechanisms and techniques which have been described are merely illustrative of one application of the principles of the invention. For instance, the specific widths of data paths and the size of the memory arrays described herein are provided merely to assist in explanation of an exemplary embodiment. Other widths and sizes are well within the scope of the principles of the invention. Numerous additional modifications may be made to the methods and apparatus described without departing from the true spirit and scope of the invention.

What is claimed is:

1. An integrated circuit comprising:
  a graphics controller which generates a row address signal, first and second column address signals for each row signal and which switches a hi/lo signal for each column address signal, to read a plurality of data words from a memory;
  said memory comprising a Dynamic Random Access Memory (DRAM) which comprises,
  a plurality of arrays, organized into an odd bank and an even bank, each array including a plurality of rows and a plurality of columns;

a pair of bit-line sense amplifiers, a first of said bit-line sense amplifiers corresponding to said odd bank and a second of said bit-line sense amplifiers corresponding to said even bank;

a row decoder which selects one of said rows in accordance with said row address received from said graphics controller, to transfer bits in a selected row to said first and said second bit-line sense amplifiers;

a column decoder which selects a pair of columns in said selected row in accordance with said first and said second column address received from said graphics controller; and a pair of multiplexers, a first of said multiplexers coupled to receive data from said first bit-line sense amplifier and a second of said multiplexers coupled to receive data from said second bit-line sense amplifier, said multiplexers responsive to said hi/lo signal generated by said graphics controller to select a first subset of bits stored in each of said bit-line sense amplifiers to generate a first data output word from said first column address in response to a first state of said hi/lo signal, and responsive to a change in value of said hi/lo signal for selecting a second subset of bits stored in each of said bit-line sense amplifiers to generate a second data output word from said first column address.

2. An integrated circuit as set forth in claim 1 wherein the memory generates a third and a fourth data output word from said row address in response to said second column address and a change in value of said hi/lo signal.

3. An integrated circuit as set forth in claim 2 wherein each of said data words consists of 128 bits.

4. A memory system comprising:

a plurality of memory arrays, each of said arrays comprising a plurality of rows, and a plurality of columns, each of said columns comprising a plurality of multi-bit memory words;

a row address decoder responsive to a row address for selecting one of said plurality of rows;

a column address decoder responsive to a column address for selecting one of said plurality of columns;

a pair of sense amplifiers responsive to said selected row for storing data contained in said row;

a selector which responds to a first value of a hi/lo signal to select a first sub-group of data, corresponding to said column address, stored in each of said bit-line sense amplifiers and to a second value of said hi/lo signal to select a second sub-group of data, corresponding to said column address, stored in each of said bit-line sense amplifiers, said first and said second sub-groups of data comprising small signal differential type signals.

5. A memory system comprising:

an odd memory bank and an even memory bank each of said banks comprised of at least one memory array arranged in a plurality of rows and columns;

a row address decoder which responds to a row address to select one of said rows of said odd and even memory banks;

an odd bit-line sense amplifier responsive to data bits in said selected row in said odd memory bank and an even bit-line sense amplifier responsive to data bits in said selected row in said even memory bank;

a column address decoder which responds to a column address to select a column of data bits from said odd bit-line sense amplifier and said even bit-line sense amplifier; and an odd set of multiplexers, responsive to a HI/LO signal, which selects a first subset of said column of data bits selected from said odd bit-line sense amplifier; and an even set of multiplexers, responsive to said HI/LO signal, which selects a second subset of said column of data bits selected from said even bit-line sense amplifier.

6. A memory system as set forth in claim 5 further comprising:

a set of odd data sense amplifiers which amplify signals selected by said odd set of multiplexers; and a set of even data sense amplifiers which amplify signals selected by said even set of multiplexers;

said odd data sense amplifiers and said even data sense amplifiers receiving small signal differential type signals and generating data outputs for said memory system in the form of full swing data signals.

7. A memory system as set forth in claim 5 wherein said odd memory bank and said even memory bank each comprise four sets of memory arrays.

8. A memory system as set forth in claim 5 wherein said memory system responds to a change in value of said HI/LO signal by providing the remainder of data selected by said column address decoder.

9. An integrated circuit comprising:

a graphics controller which generates a row address signal, a column address signal and which switches a hi/lo signal corresponding to said column address signal, to read a plurality of data words from a memory;

said memory comprising a Dynamic Random Access Memory (DRAM) which comprises, an odd memory bank and an even memory bank each of said banks comprised of at least one memory array arranged in a plurality of rows and columns;

a row address decoder which responds to a row address to select one of said rows of said odd and even memory banks;

an odd bit-line sense amplifier responsive to data bits in said selected row in said odd memory bank and an even bit-line sense amplifier responsive to data bits in said selected row in said even memory bank;

a column address decoder which responds to said column address to select a column of data bits from said odd bit-line sense amplifier and said even bit-line sense amplifier; and an odd set of multiplexers, responsive to said hi/lo signal, which selects a first subset of said column of data bits selected from said odd bit-line sense amplifier; and an even set of multiplexers, responsive to said hi/lo signal, which selects a second subset of said column of data bits selected from said even bit-line sense amplifier.

10. An integrated circuit as set forth in claim 9 wherein said memory system further comprises:

a set of odd data sense amplifiers which amplify signals selected by said odd set of multiplexers; and a set of even data sense amplifiers which amplify signals selected by said even set of multiplexers;

said odd data sense amplifiers and said even data sense amplifiers amplifiers receiving small signal differential type signals and generating data outputs for said memory system in the form of full swing data signals.

11. A memory system as set forth in claim 10 wherein said odd memory bank and said even memory bank each comprise four sets of memory arrays.

12. A memory system as set forth in claim 11 wherein said memory system responds to a change in value of said hi/lo signal by providing the remainder of data selected by said column address decoder.

13. An integrated circuit as set forth in claim 1 wherein said first and said second data output words generated by said pair of multiplexers are small signal differential type signals.

14. A memory system as set forth in claim 5 wherein said first subset of said column of data bits selected from said odd bit-line sense amplifier and said second subset of said column of data bits selected from said even bit-line sense amplifier are small signal differential type signals.

15. A memory system as set forth in claim 6 wherein said odd data sense amplifiers and said even data sense amplifiers receive small signal differential type signals.

16. A memory system as set forth in claim 8 wherein said data selected by said column address decoder are small signal differential type signals.

17. An integrated circuit as set forth in claim 9 wherein said data words read by said graphics controller are full swing type signals and wherein said data bits selected by said column address decoder are small signal differential type signals.

18. An integrated circuit as set forth in claim 9 wherein said data words read by said graphics controller are full swing type signals and wherein said data bits generated by said odd and said even bit-line sense amplifiers are small signal differential type signals and wherein said data bits selected by said column address decoder are small signal differential type signals.

* * * * *